(12) United States Patent
Tanada

(10) Patent No.: US 7,554,359 B2
(45) Date of Patent: *Jun. 30, 2009

(54) CIRCUIT FOR INSPECTING SEMICONDUCTOR DEVICE AND INSPECTING METHOD

(75) Inventor: Yoshifumi Tanada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 43 days.

This patent is subject to a terminal disclaimer.

(21) Appl. No.: 11/712,886

(22) Filed: Mar. 1, 2007

(65) Prior Publication Data

US 2007/0159211 A1    Jul. 12, 2007

Related U.S. Application Data

(63) Continuation of application No. 10/807,692, filed on Mar. 24, 2004, now Pat. No. 7,187,204.

(30) Foreign Application Priority Data

Mar. 25, 2003  (JP)  ............................. 2003-081666
May 15, 2003  (JP)  ............................. 2003-137822

(51) Int. Cl.
   H03K 19/21    (2006.01)
   G06K 7/50     (2006.01)

(52) U.S. Cl. ................................ 326/52; 326/54; 326/9; 345/100; 345/84

(58) Field of Classification Search .................... 326/9, 326/11–14, 52, 54; 345/92, 104
See application file for complete search history.

(56) References Cited

U.S. PATENT DOCUMENTS 4,775,891 A   10/1988   Aoki et al.
5,068,547 A   11/1991   Gascoyne
5,367,551 A   11/1994   Okumura et al.
5,410,247 A    4/1995   Ishizuka
5,825,204 A   10/1998   Hashimoto
6,194,930 B1*  2/2001   Matsuzaki et al. .......... 327/156
6,455,336 B1   9/2002   Berndlmaier et al.

(Continued)

FOREIGN PATENT DOCUMENTS

JP         5-256914        10/1993

(Continued)

OTHER PUBLICATIONS

International Search Report re application No. PCT/JP2004/003549, dated Apr. 27, 2004 (in Japanese).

(Continued)

*Primary Examiner*—Vibol Tan
(74) *Attorney, Agent, or Firm*—Cook Alex Ltd.

(57) ABSTRACT

It is configured by plurality of NAND circuits connected in series through a plurality of inverters, and a plurality of NOR circuits connected in series through the plurality of inverters. Each of a plurality of source signal lines provided in a pixel portion is connected to one input terminal of a NAND circuit and a NOR circuit, and an output of an inspection is obtained from final lines of the NAND circuit and the NOR circuit connected in series. In this manner, an inspecting circuit which is capable of determining a defect simply and accurately by using a small-scale circuit, and a method thereof are provided.

17 Claims, 17 Drawing Sheets

U.S. PATENT DOCUMENTS

| | | |
|---|---|---|
| 6,573,774 B1 | 6/2003 | Gardner |
| 6,651,196 B1 | 11/2003 | Iwase et al. |
| 6,711,041 B2 | 3/2004 | Pereira et al. |
| 6,762,617 B2 | 7/2004 | Iwase et al. |
| 6,762,735 B2 | 7/2004 | Koyama |
| 6,850,080 B2 | 2/2005 | Hiroki |
| 2001/0035526 A1 | 11/2001 | Yamazaki et al. |
| 2001/0040565 A1 | 11/2001 | Koyama |
| 2002/0130675 A1 | 9/2002 | Hiroki |
| 2002/0132383 A1 | 9/2002 | Hiroki et al. |
| 2004/0119824 A1 | 6/2004 | Osada |
| 2004/0239598 A1 | 12/2004 | Koyama |
| 2005/0212044 A1 | 9/2005 | Hiroki |
| 2006/0156111 A1 | 7/2006 | Nozawa |
| 2008/0028268 A1 | 1/2008 | Osada |

FOREIGN PATENT DOCUMENTS

| | | |
|---|---|---|
| JP | 2618042 | 6/1997 |
| JP | 2000-47255 | 2/2000 |
| JP | 2001-215463 | 8/2001 |
| JP | 2002-14337 | 1/2002 |
| JP | 2002-32035 | 1/2002 |
| JP | 2002-116423 | 4/2002 |
| JP | 2002-350513 | 12/2002 |
| JP | 2003-31814 | 1/2003 |

OTHER PUBLICATIONS

Written Opinion re application No. PCT/JP2004/003549, dated Apr. 27, 2004 (with partial English translation).

* cited by examiner

Defect operation mode A

Defect operation mode B

FIG. 6A  Defect operation mode C

Defect operation mode F

| in1 | in2 | out |
|-----|-----|-----|
| H | H | H |
| H | L | L |
| L | H | L |
| L | L | H |

US 7,554,359 B2

CIRCUIT FOR INSPECTING SEMICONDUCTOR DEVICE AND INSPECTING METHOD

This application is a continuation of U.S. application Ser. No. 10/807,692, filed on Mar. 24, 2004 now U.S. Pat. No. 7,187,204.

TECHNICAL FIELD

The present invention relates to an inspecting circuit provided in a display device having a pixel region in which pixels are arranged in matrix, and an inspecting method of the display device. Further, the invention relates to an inspecting circuit and an inspecting method of a semiconductor device having a pixel region in which pixels are arranged in matrix.

BACKGROUND OF THE INVENTION

A display device such as a liquid crystal display (LCD) and an electroluminescence (EL) display has been advanced in size and definition in recent years. Furthermore, high integration of circuits is also advanced by forming a pixel portion and peripheral circuitry for controlling the pixel portion integrally on a substrate.

In the case where element breakdown occurs due to patterning defects, electrostatic discharge (ESD) event and the like in the manufacturing process, a normal operation of the display device as a whole cannot be obtained, therefore, they are required to be eliminated by a quality inspection. Generally, a quality inspection of a display device is carried out in the phase of a module 1200 as a completed product as shown in FIG. 12A in which a TFT substrate 1201 over which a source driver 1203, a gate driver 1204, a pixel region 1205, a signal input terminal 1206 and the like are formed and a counter substrate 1202 are attached, and by inputting signals by actually using a jig 1211 and the like in order to display a picture or an image (a test pattern 1212 and the like) and observe the presence or absence of display defects by looking at the display as shown in FIG. 12B.

According to this method, however, an inspection is carried out in the phase that a display device itself is almost completed as the module 1200, therefore, there is a defect that much cost is spent on a module which is determined to be defective. That is, since a defect due to a circuit defect originates in the TFT substrate 1201 only, the process for attaching the counter substrate 1202 and the like results in waste. Further, in the case of manufacturing only a substrate (TFT substrate) whose pixel portion or peripheral circuitry is formed of a TFT and the like and shipping it as a semi-finished product, it is virtually impossible to carry out a quality inspection by an actual display in this case. That is, what is required is a means for determining a circuit operation to be normal or not in the state of a TFT substrate.

FIG. 11 is an example of a configuration which enables such an inspection. Formed over a substrate are a shift register (SR) and a NAND circuit 19, a data latch 20, a D/A converter (DAC) 21, a video data line 23, a digital source driver 18 formed of input terminals 22, 16 and the like of a signal, a power supply and the like, a gate driver 5, a pixel region in which pixels 3 are arranged in matrix, a capacitor line 15, a switch driver circuit 30, an analog switch 25, an inspecting line 27, an inspecting terminal 28 and the like.

In a display device shown in FIG. 11, each gate signal line 6 controls a pixel connected to a relevant line, and a video signal is inputted to a digital source driver 18, outputted to a source signal line 9, and written to each pixel.

In an inspecting circuit, a charge held in a capacitor 2 is taken out at an inspecting terminal 28 through the inspecting line 27 sequentially by writing video signals in a pixel through each pixel TFT 1, whereby writing to a pixel is determined to be good or defective. Further, the analog switch 25 is controlled by the switch driver circuit 30 (refer to Patent Document 1). There is a method for inspecting an output by touching a probe to each pad which is provided in each source line 9 for inspection (refer to Patent Document 2).

[Patent Document 1]
  Japanese Patent Laid-Open No. 2002-116423

[Patent Document 2]
  Patent No. 2618042 Specification

SUMMARY OF THE INVENTION

According to the method disclosed in the aforementioned patent documents, the through put of the inspection is drastically decreased in a display device having a large display which provides a high definition, and the switch driver circuit 30 is required for the control. Thus, such problems arise as an increase in mounting area of the inspecting circuit over the substrate and the like. In particular, the former method is impractical for a high definition display device.

The present invention has been made in view of the above problems. The present invention provides an inspecting circuit and an inspecting method which are capable of determining a circuit operation, the presence or absence of line defects and the like by using quite a simple method and a small-scale inspecting circuit.

In order to solve the aforementioned problems, the following means is made in the invention.

The method to use a probe for inspecting the signals outputted to the increased number of signal lines in accordance with the higher definition is also impractical in the respect of the through put of inspection and the like as described above. In the invention, outputs of all signal lines are inputted to the inspecting circuit to obtain as a determination result a certain pattern obtained respectively to all the inputs. Then, a pattern of an inspection output in the case where everything is normal is prepared in advance as a reference pattern and compared with the determination result.

In the case where an output of a certain signal line is invalid, a different output is to be obtained than the aforementioned reference pattern. Therefore, an output of one to a plurality of points is measured to be compared with the output which is obtained under the normal state for determination whether right or wrong. Thus, an inspection of each pulse output is not required to be performed and the presence or absence of defects can be rapidly determined.

According to the invention, a determination can be performed in the state of a TFT substrate without performing an inspection by looking at an actual test pattern display, therefore, an efficient quality inspection can be performed quite simply by a small-scale inspecting circuit.

Specifically, determination of a circuit operation can be performed in a various display devices such as an LCD, an EL display, and a plasma display which use a digital signal as a video signal. Further, an inspection can be performed quite simply by operating a driver similarly to the case of a normal display without a need of a circuit for driving the inspecting circuit itself. In addition, by only inspecting H level/L level of an output at an inspecting output terminal regardless of the number of source signal lines, the presence or absence of defects can be determined immediately in all lines. Therefore, the invention is efficient for the inspection of a display device used in a panel having a large display which provides a high definition.

BRIEF DESCRIPTION OF THE DRAWINGS

FIGS. 6A and 6B are diagrams showing an operation of an inspecting circuit and an output of inspection in a defect operation mode C.

DETAILED DESCRIPTION OF THE PRESENTLY PREFERRED EMBODIMENTS

Embodiment modes of the invention are described in details with reference to the drawings. Although the present invention will be fully described by way of example with reference to the accompanying drawings, it is to be understood that various changes and modifications will be apparent to those skilled in the art. Therefore, unless such changes and modifications depart from the scope of the present invention, they should be construed as being included therein. Further, in the following description, similar components among different drawings are denoted by the same reference symbols or numerals.

Embodiment Mode 1

Figure 1A:
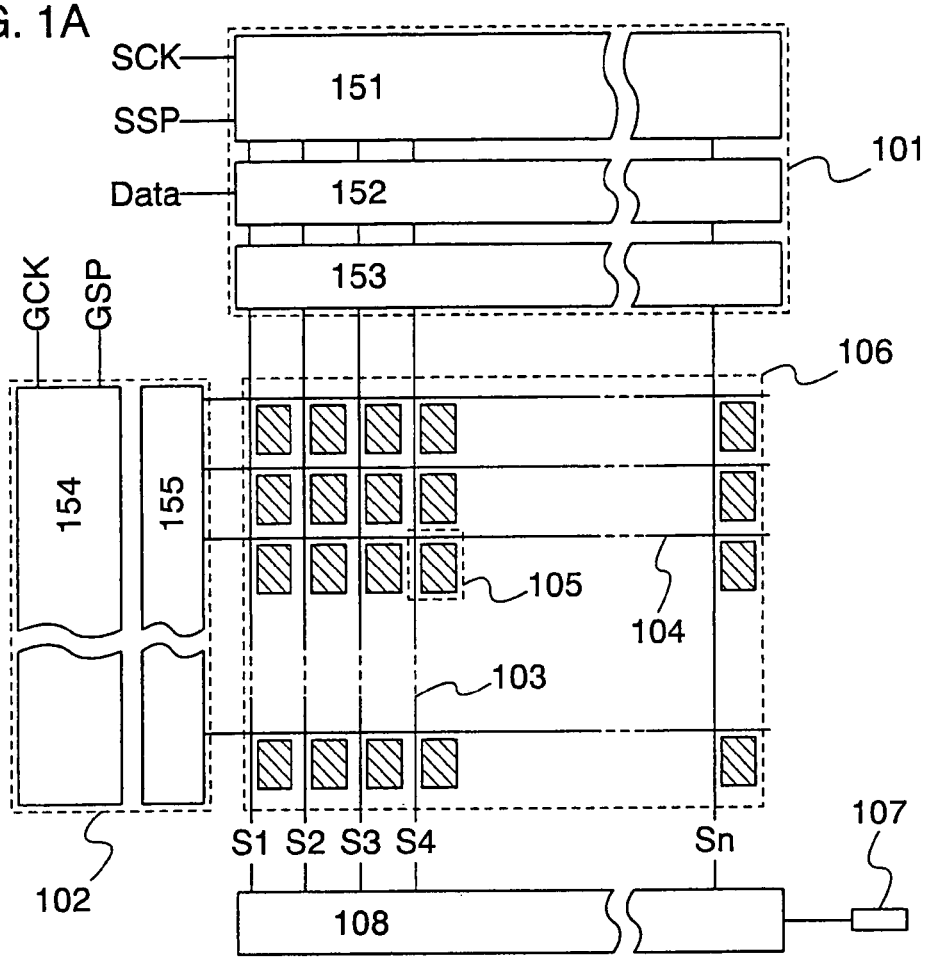
FIGS. 1A and 1B are diagrams showing one embodiment mode of the invention.

FIG. 1A shows an embodiment mode of the invention. A source driver 101, a gate driver 102, a pixel region 106, an inspecting circuit 108, and an inspecting output terminal 107 are formed over a substrate. The pixel region 106 comprises a plurality of pixels 105 are formed in matrix, and each of the pixels is controlled by a source signal line 103 and a gate signal line 104.

The source driver 101 comprises a shift register and a NAND 151, a data latch 152, a level shifter and a buffer 153, and the gate driver 102 comprises a shift register and a NAND 154, a level shifter and a buffer 155. However, no restriction is imposed upon the configuration of the display device here.

Figure 1B:
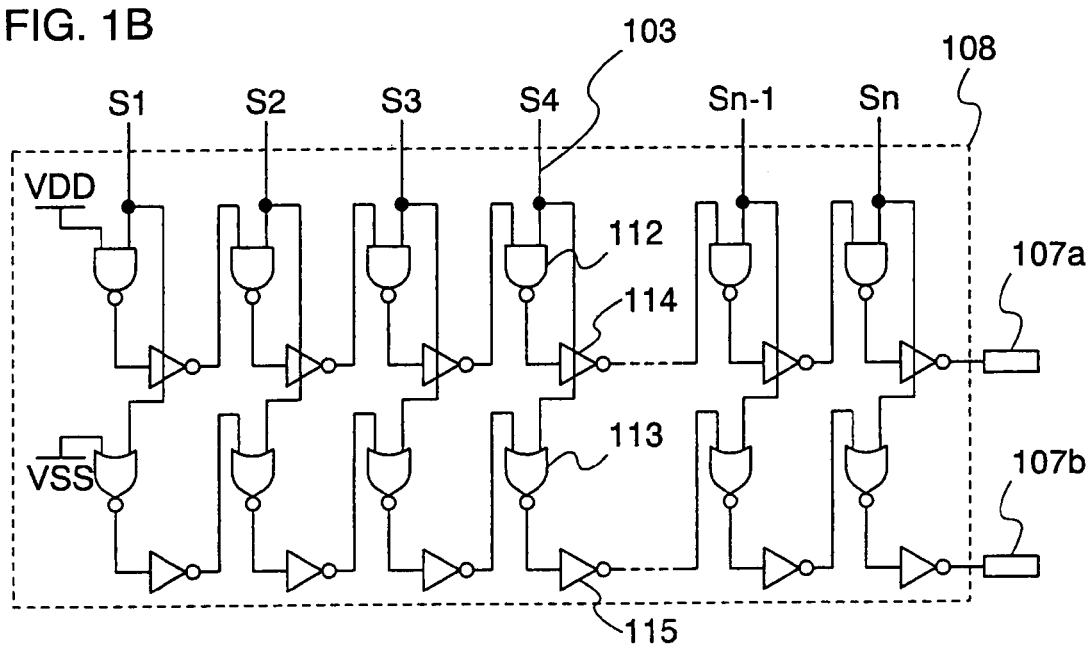

A configuration of the inspecting circuit is shown in FIG 1B. In the inspecting circuit 108, circuits connected to each source signal line 103, in which a plurality of NANDs 112 and a plurality of inverters 114 are connected alternately in series, and circuits connected to each source signal line 103, in which a plurality of NORs 113 and a plurality of inverters 115 are connected alternately in series are connected in parallel, and outputs of both final lines are outputted to inspecting output terminals 107a and 107b.

In the inspecting circuit 108, specifically, a first input end of the NAND of a first line is connected to a power supply (VDD), a second input end thereof is connected to a source signal line (S1), and an output end thereof is connected to an input end of an inverter of the first line. An output end of the inverter of the first line is connected to a first input end of a NAND of a second line. In a certain m-th ($2 \leq m \leq n$) line after the second line, a first input end of the NAND of the m-th line is connected to an output end of an inverter of a (m−1)th line, a second input end thereof is connected to a source signal line (Sm), and an output end thereof is connected to an input end of an inverter of the m-th line. An output end of the inverter of the m-th line is connected to a first input end of the NAND of a (m+1)th line. An output of an inverter of the final line, that is an n-th line is outputted to the inspecting output terminal 107a.

On the other hand, a first input end of a NOR 113 of the first line is connected to a power supply (VSS), a second input end thereof is connected to the source signal line (S1), and an output end thereof is connected to an input end of an inverter of the first line. An output end of the inverter of the first line is connected to a first input end of a NOR of the second line. In a certain m-th line after the second line, a first input end of a NOR of the m-th line is connected to an output end of an inverter of a (m−1)th line, a second input end thereof is connected to the source signal line (Sm), and an output end thereof is connected to an input end of the inverter of the m-th line. An output end of the inverter of the m-th line is connected to a first input end of a NOR of the (m+1)th line. An output of an inverter of the final line, that is the n-th line is outputted to the inspecting output terminal 107b.

Next, a procedure of an actual inspection is described with reference to FIGS. 1A and 1B. Here, a source driver of a line sequence digital method is taken as an example.

As the inspection, the source driver 101 is operated. An operating method may be similar to the case of performing a normal image display. In the inspection, however, a state that all the source signal lines output H-level and a state that all the source signal lines output L-level are sequentially inputted.

Figure 2:
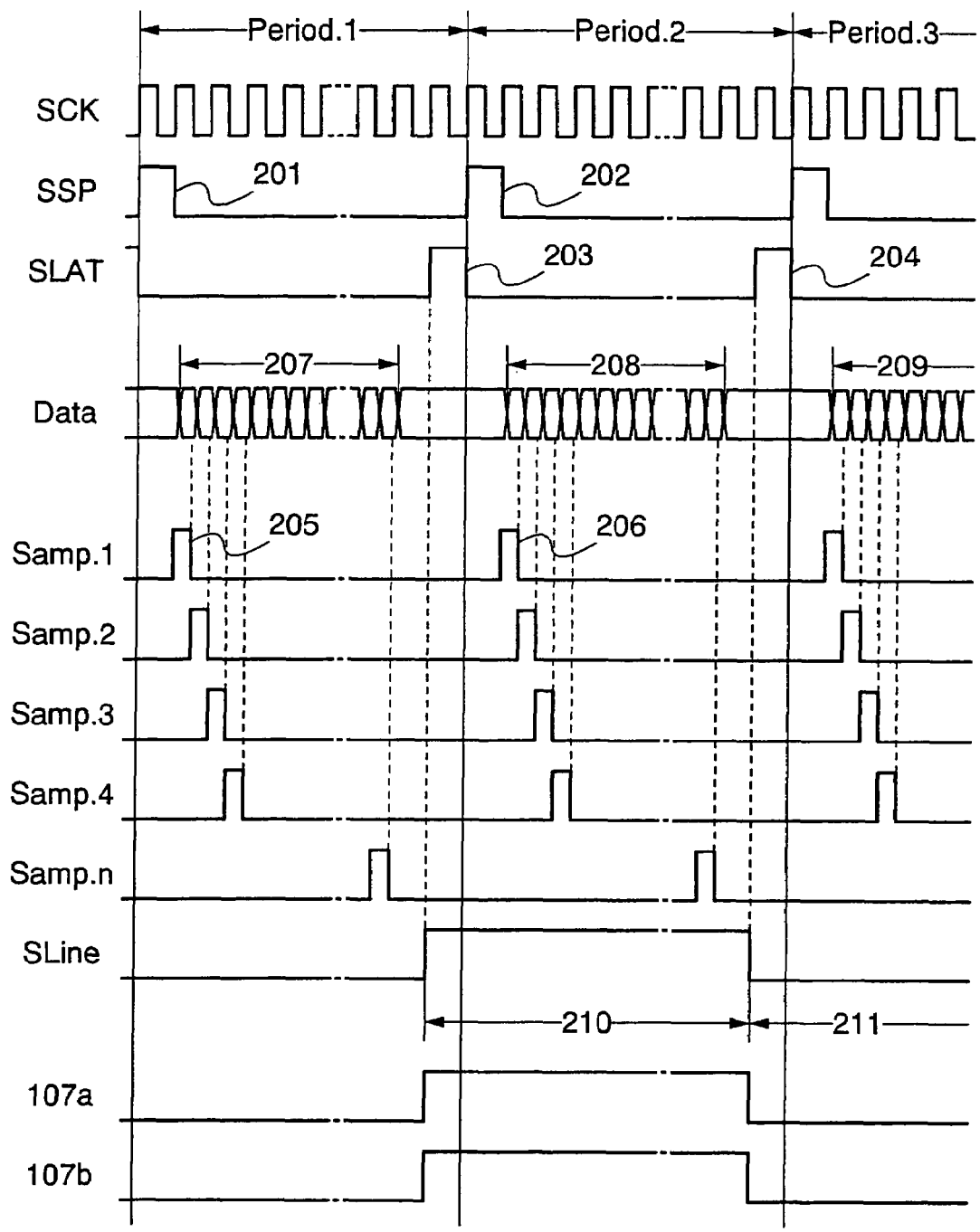
FIG. 2 is diagram showing a timing chart of a source driver and an inspecting circuit.

FIG. 2 is a simple timing chart of the source driver 101 and its operation is described sequentially below. FIG. 2 shows a clock signal (SCK), a start pulse (SSP), a latch pulse (SLAT), and a digital image signal (Data) as input signals, and sampling pulses (Samp. 1 to 4 and Samp. n) of first to fourth lines and the final line, and a source signal line output (SLine:data of S1 to Sn change all at once because this is a linear sequential drive) as output signals.

First, a first line period (Period 1) is described. A shift register operates in accordance with a clock signal and a start pulse 201, and sampling pulses 205 are sequentially outputted. The sampling pulse 205 each samples a digital video signal and holds the data in a latch circuit.

Note that digital video signals 207 inputted in the first line period are all H-level.

When a latch pulse 203 is inputted after sampling of digital video signals are terminated in the final line, the data held in the latch circuit is outputted to the source signal lines all at once. The outputs of the source signal lines at this time are also held by the latch circuit during a period until a next latch pulse 204 is inputted.

Here, the outputs of the source signal lines are H-level in all the lines (210).

Next, a second line period (Period 2) starts. Sampling pulses 206 are sequentially outputted in accordance with a clock signal and a start pulse 202 and digital video signals are sampled as same as the first line period.

Note that digital video signals 208 inputted in the second line period are all L-level.

Next, when the latch pulse 204 is inputted, the data held in the latch circuit are outputted to the source signal lines all at once. The outputs of the source signal lines are L-level in all the lines (211).

Figure 3A:
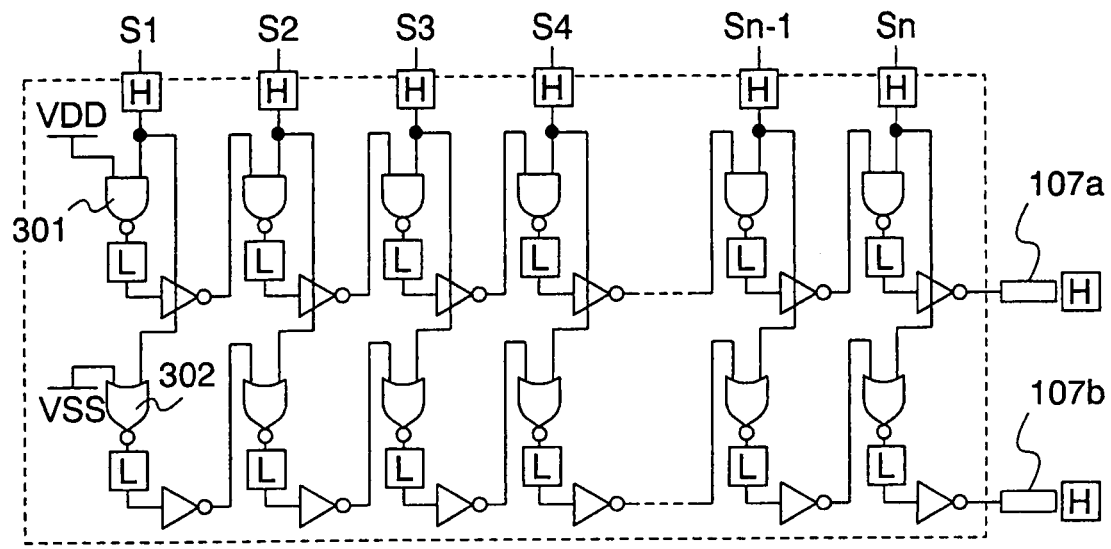
FIGS. 3A and 3B are diagrams showing an operation of an inspecting circuit and an output of inspection in the normal operation.

Next, an operation and the like of the inspecting circuit are described. At this time, the source signal lines output H-level in all the lines in the period 210. Therefore, the inspecting circuit is in a state as shown in FIG. 3A. A first input end of a NAND 301 is inputted with a power supply (VDD) while a second input end thereof is inputted with H-level. Therefore, an output of the NAND 301 is L-level. Furthermore, this output is inverted through an inverter and inputted to a NAND of a next line. The aforementioned operation is repeated and H-level is outputted to the inspecting output terminal 107a finally.

On the other hand, a first input end of a NOR 302 is inputted with the power supply (VSS) while a second input end thereof is inputted with H-level. Therefore, an output of the NOR 302 is L-level. Further, this output is inverted through an inverter and inputted to a NOR of a next line. The aforementioned operation is repeated after this, and H-level is outputted to the inspecting output terminal 107b finally.

Figure 3B:
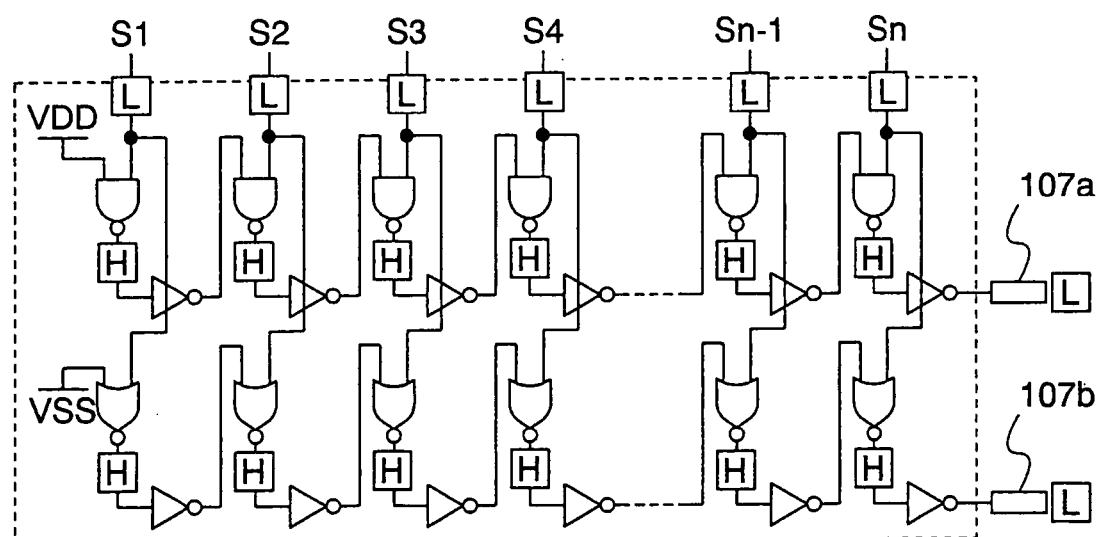

Next, the source signal lines output L-level in all the lines in a period shown by a reference numeral 211. Therefore, the inspecting circuit is in a state as shown in FIG. 3B. NANDs and NORs connected to all the source signal lines operate as described above, and L-level is outputted to both of the inspecting output terminals 107a and 107b in this case.

The state of the inspecting output terminal in this case is a normal output of the inspection, that is the case where H-level is outputted to each of the inspecting output terminals when outputs of the source signal lines are H-level in all the lines, while L-level is outputted to each of the inspecting output terminals when the source signal lines are L-level in all the lines. That is, it indicates that sampling of H-level video signals and L-level video signals are normally performed and charge and discharge of the source signal lines are performed.

Reference numerals 107a and 107b at bottom lines of the timing chart in FIG. 2 show output waveforms of the inspecting output terminals 107a and 107b.

Here, several kinds of defect operation modes are assumed, which are described in following A to F.

A: the case where an output of the source signal line (S4) is fixed at H-level

B: the case where the output of the source signal line (S4) is fixed at L-level

C: the case where the output of the source signal line (S4) is inverted from a normal case D: the case where outputs of the source signal lines (S2 and S4) are fixed at H-level E: the case where the output of the source signal line (S2) is fixed at H-level and an output of the source signal line (Sn) is fixed at L-level F: the case where the output of the source signal line (S2) is fixed at L-level and the output of the source signal line (Sn) is inverted from a normal case These defect operations can be caused by a short-circuit of a source signal line and a power supply line and the like due to, for example, patterning defects, by an defect operation of a circuit due to element breakdown caused by electrostatic discharge event in the manufacturing process, and the like. Operations of the inspecting circuit are described below as for each defect operation A to F.

Figure 4A:
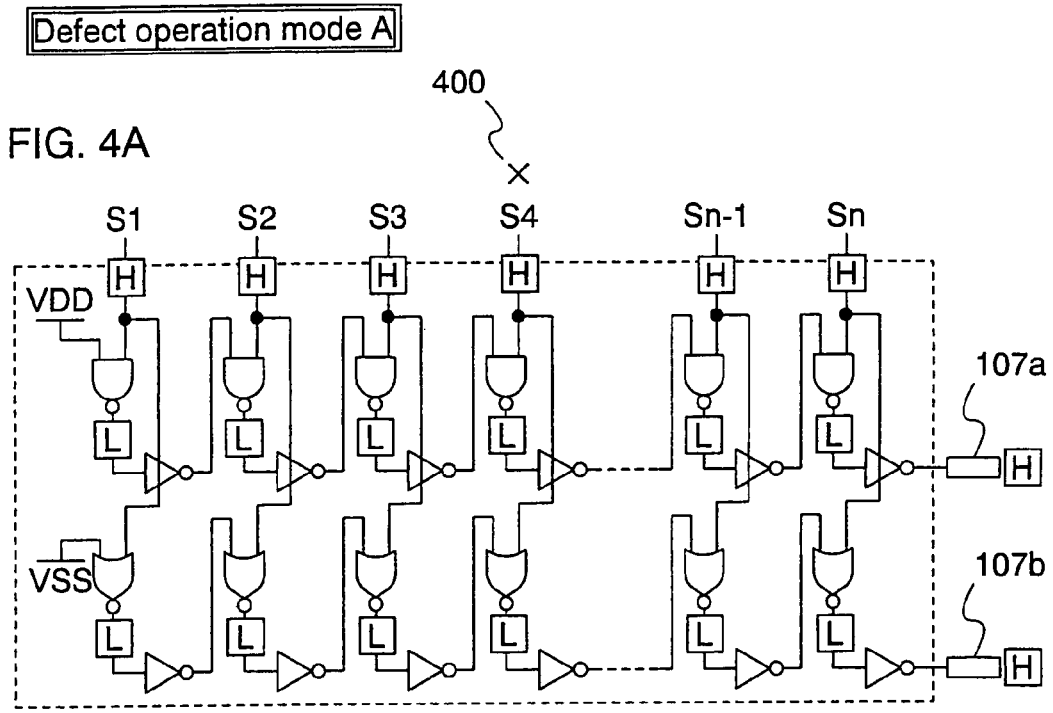
FIGS. 4A and 4B are diagrams showing an operation of an inspecting circuit and an output of inspection in a defect operation mode A.
Figure 4B:
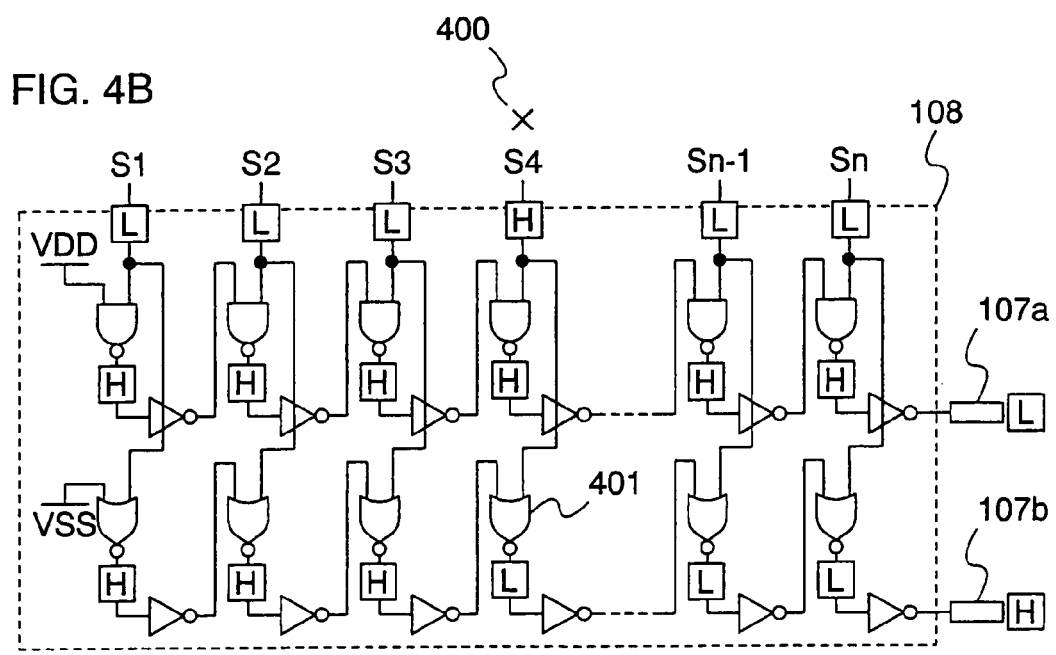

FIGS. 4A and 4B show operations of the inspecting circuit and outputs of inspection in the defect operation mode A. In this defect operation mode, the source signal line (S4) is fixed at H-level irrespective of a digital video signal. The defect is shown by an "x" mark 400. At this time, source signal lines output H-level in all the lines, that is a similar logic to a normal operation in FIG. 4A. Therefore, H-level is outputted to the both inspecting output terminals 107a and 107b, which is determined to be normal. However, when the source signal lines output L-level in all the lines, a logic inversion occurs in a NOR 401 as shown in FIG. 4B. This inverted logic remains and an H-level is outputted to the inspecting output terminal 107b, which is determined to be defective.

Figure 5A:
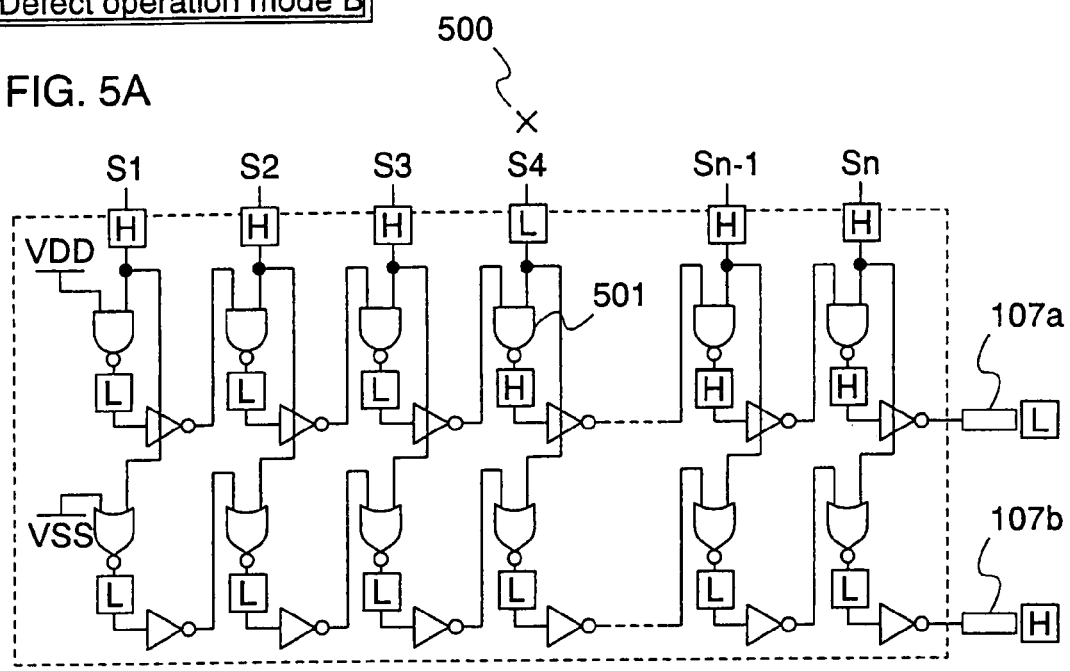
FIGS. 5A and 5B are diagrams showing an operation of an inspecting circuit and an output of inspection in a defect operation mode B.
Figure 5B:
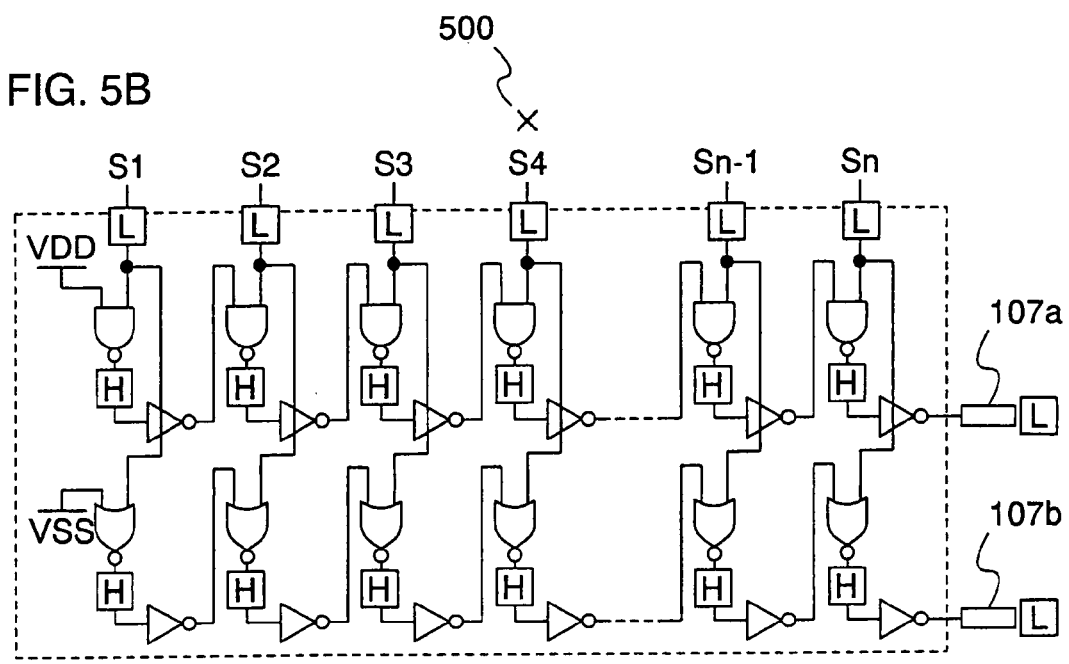

FIGS. 5A and 5B show operations of the inspecting circuit and outputs of inspection in the defect operation mode B. In this defect operation mode, the source signal line (S4) is fixed at L-level irrespective of a digital video signal. The defect is shown by an "x" mark 500. The source signal lines output L-level in all the lines that is a similar logic to a normal operation in FIG. 4B. Therefore, L-level is outputted to the both inspecting output terminals 107a and 107b, which is determined to be normal. However, when the source signal lines output H-level in all the lines, a logic inversion occurs in a NAND 501 and L-level is outputted to the inspecting output terminal 107a, which is determined to be defective.

Figure 6B:
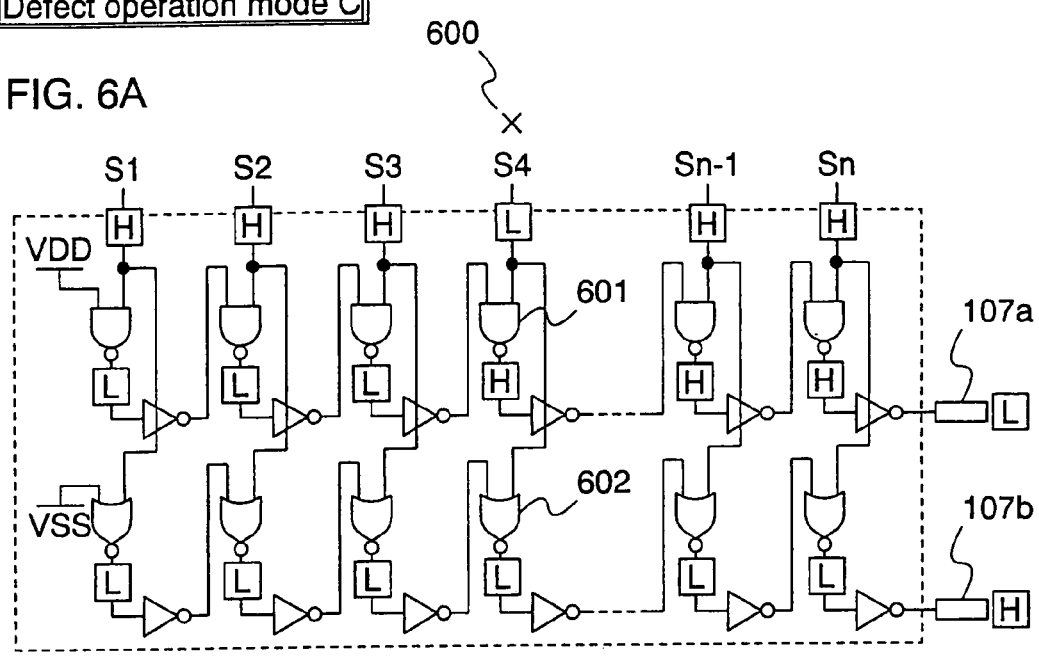
Figure 6B:
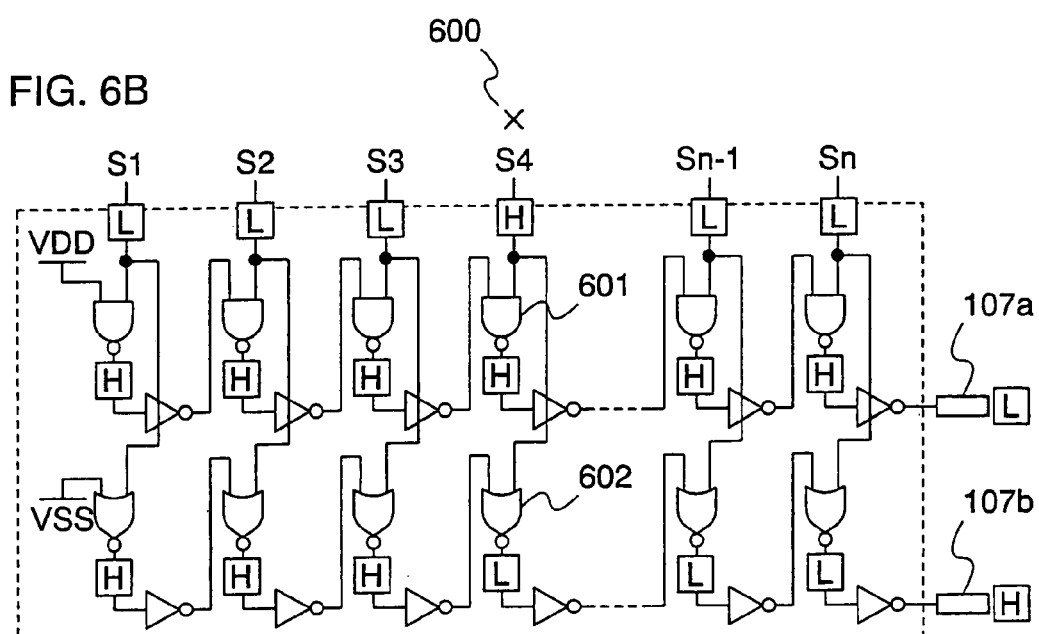

FIGS. 6A and 6B show operations of the inspecting circuit and outputs of inspection in the defect operation mode C. In this defect operation mode, output of the source signal line (S4) is inverted relatively to a digital video signal. The defect is shown by an "x" mark 600. In this case, logic is inverted in each of a NAND 601 and NOR 602 in both cases where the source signal lines output H-level in all the line and where they output L-level. It is determined to be defective when L-level is outputted to the inspecting output terminal 107a in the former case and when H-level is outputted to the inspecting output terminal 107b in the latter case.

The examples heretofore are described on the cases where one defect exists relatively to all the source signal lines. In the operation modes D to F, a plurality of defects exist.

Figure 7A:
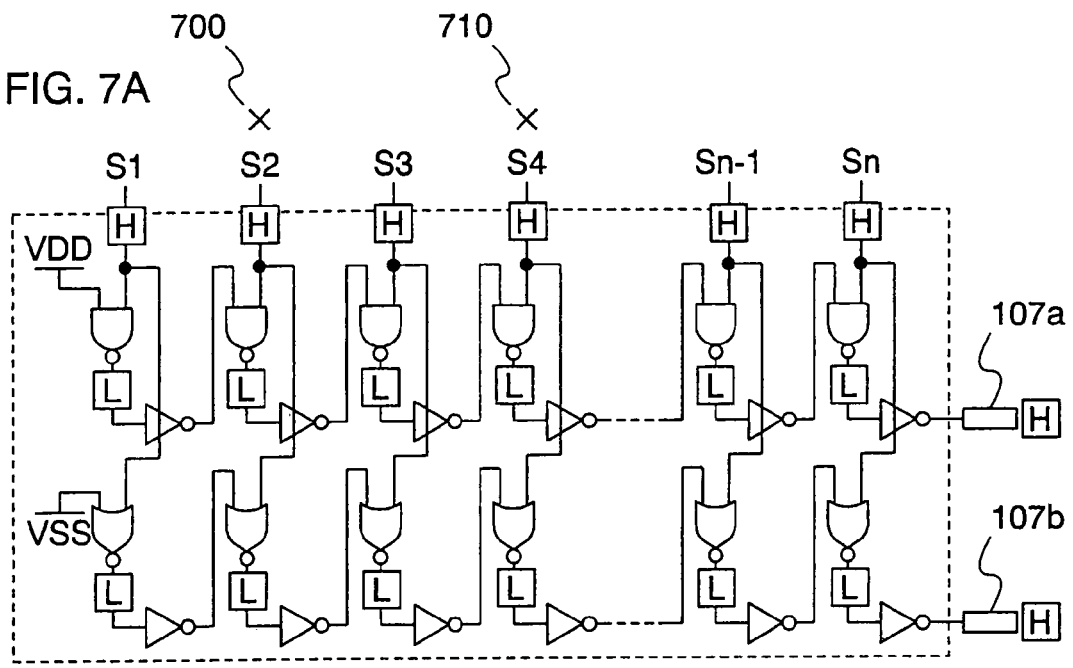
FIGS. 7A and 7B are diagrams showing an operation of an inspecting circuit and an output of inspection in a defect operation mode D.
Figure 7B:
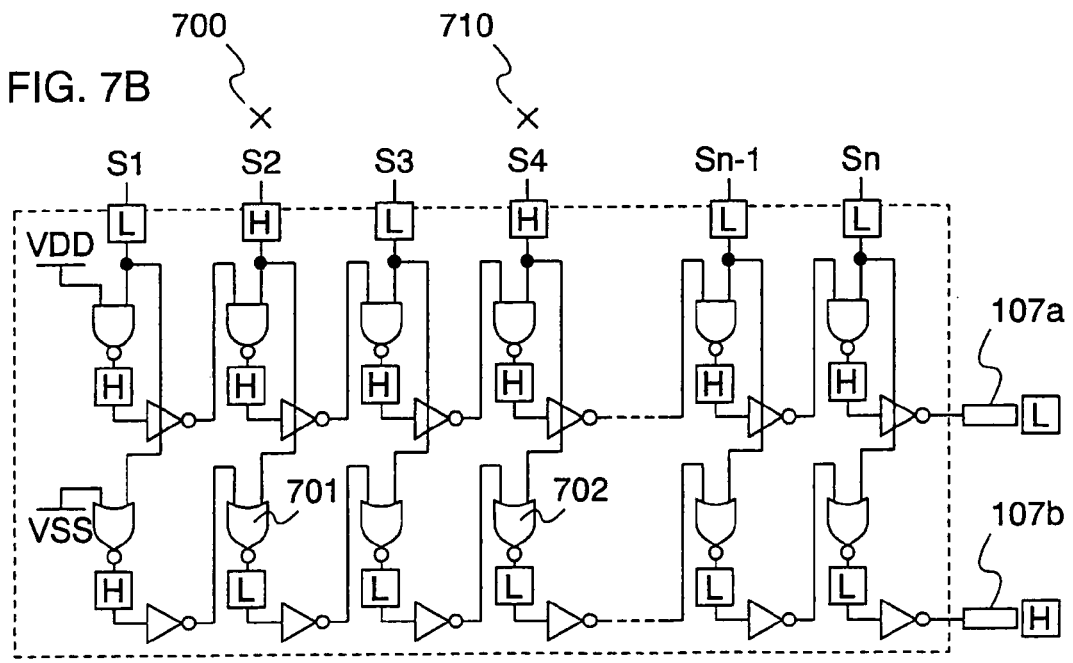

FIGS. 7A and 7B show operations of the inspecting circuit and outputs of inspection in the defect operation mode D. In this defect operation mode, the two source signal lines (S2 and S4) are both fixed at H-level irrespective of digital video signals. The defects are shown by "x" marks 700 and 710. The case where the source signal lines output H-level in all the lines, that is the case of FIG. 7A, is a similar logic to a normal operation, which is determined to be normal. As shown in FIG. 7B, however, in the case where a plurality of defects exist, after a logic is inverted at a defect which appears first, that is a NOR 701 connected to the source signal line (S2), an inversion of logic is stored as it is without changing at a defect which appears next, that is a NOR 702 connected to the source signal line (S4). Therefore, H-level is outputted to the inspecting output terminal 107b, which is determined to be defective.

Figure 8A:
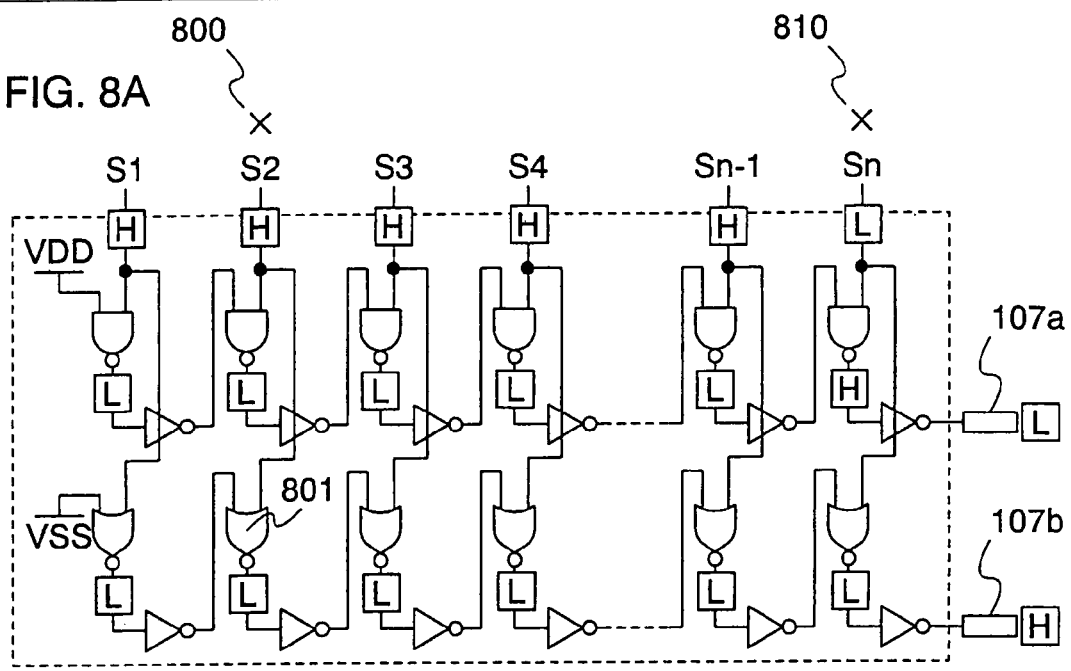
FIGS. 8A and 8B are diagrams showing an operation of an inspecting circuit and an output of inspection in a defect operation mode E.
Figure 8B:
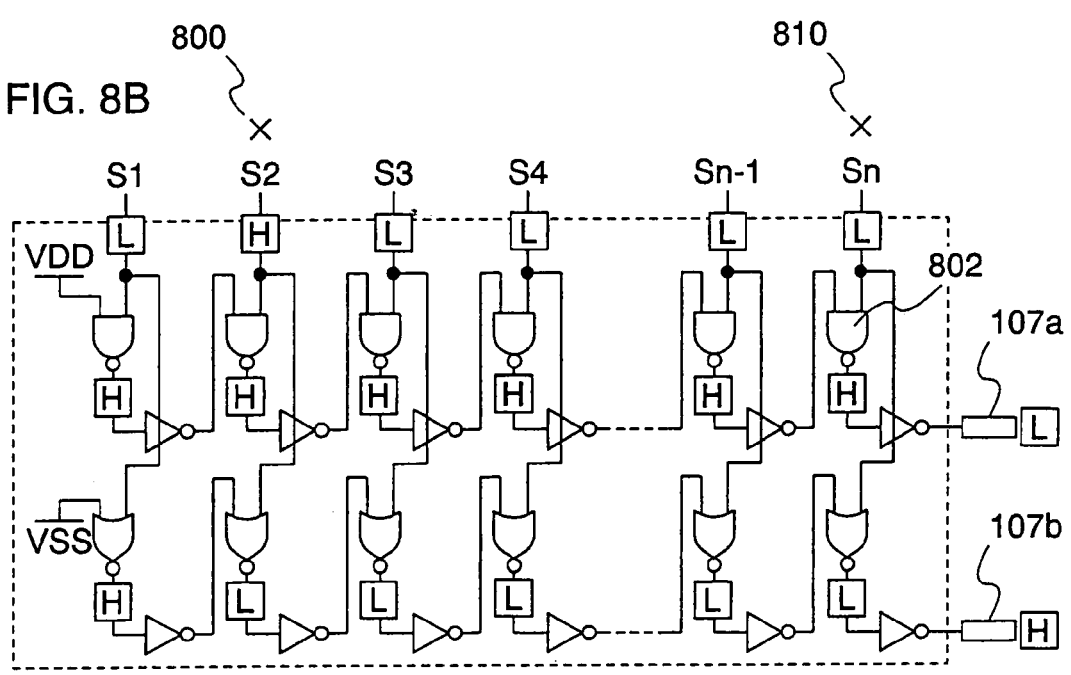

FIGS. 8A and 8B show operations of the inspecting circuit and outputs of inspection in the defect operation mode E. In this defect operation mode, a source signal line (S2) is fixed at H-level irrespective of a digital video signal and a source signal line (Sn) is fixed at L-level irrespective of a digital video signal. The defects are shown by "x" 800 and 810. As shown in FIGS. 8A and 8B, as for the former defect, logic is inverted in a NOR 802 to output H-level to an inspecting output terminal 107b while logic is inverted at a NAND 801 as for the latter defect to output L-level to an inspecting output terminal 107a. Therefore, determination of defects is obtained. In this manner, even when a plurality of defects of different modes occur, an accurate determination is performed without interrupting outputs of inspection of each other.

Figure 9A:
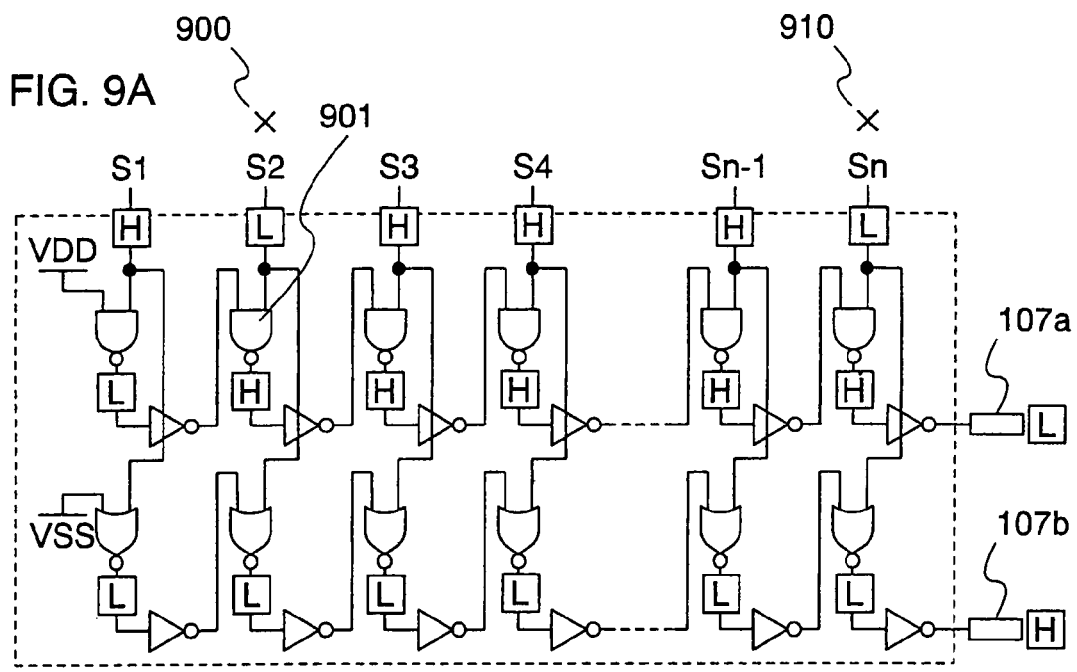
FIGS. 9A and 9B are diagrams showing an operation of an inspecting circuit and an output of inspection in a defect operation mode F.
Figure 9B:
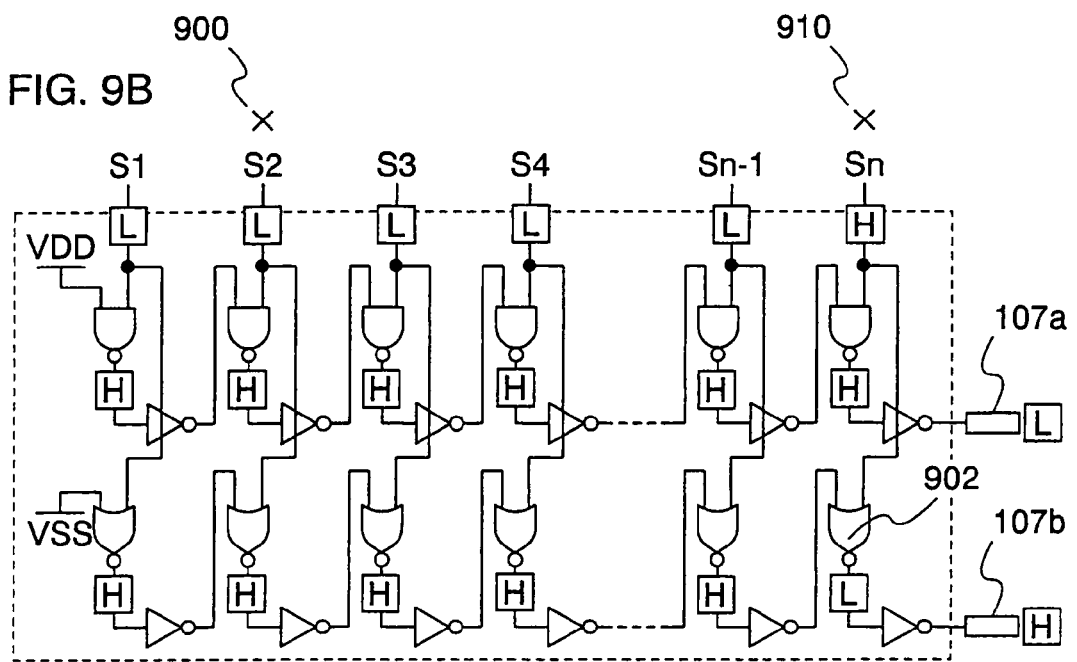

FIGS. 9A and 9B show operations of the inspecting circuit and outputs of inspection in the defect operation mode F. In this defect operation mode, a source signal line (S2) is fixed at L-level irrespective of a digital video signal and an output is inverted relatively to the digital video signal in a source signal line (Sn). The defects are shown by "x" 900 and 910. As shown in FIGS. 9A and 9B, as for the former defect, logic is inverted in a NAND 901 to output L-level to an inspecting output terminal 107a while logic is inverted in a NOR 902 as for the latter defect to output H-level to an inspecting output terminal 107b. Therefore, determination of defects is obtained. In this mode also, an accurate determination is performed without a defect of the source signal line Sn interrupting the logic inversion by the NAND 901.

As described above, the inspecting circuit of the invention can determine various kinds of defects quite accurately. A quality check of a circuit operation can be performed to various kinds of display devices such as an LCD, an EL display, a plasma display as long as they have a driver which is inputted with digital video signals and outputs digitally to a source signal line. Moreover, an inspection can be performed quite simply only by operating a driver normally without a need of a circuit for driving the inspecting circuit itself.

As shown in FIGS. 3 to 9, the inspection is determined to be normal in the case where an output (signal) of an inspecting output terminal connected beside a circuit configured by using NANDs and an output (signal) of an inspecting output terminal connected beside a circuit configured by using NORs are the same in both cases where a digital video signal is H-level and the case where it is L-level. When some defects are determined, outputs of two inspecting output terminals are different. Therefore, by providing a comparator circuit for determining the equality of the outputs of these two inspecting output terminals, the output of inspection can be obtained more easily.

Figure 10A:
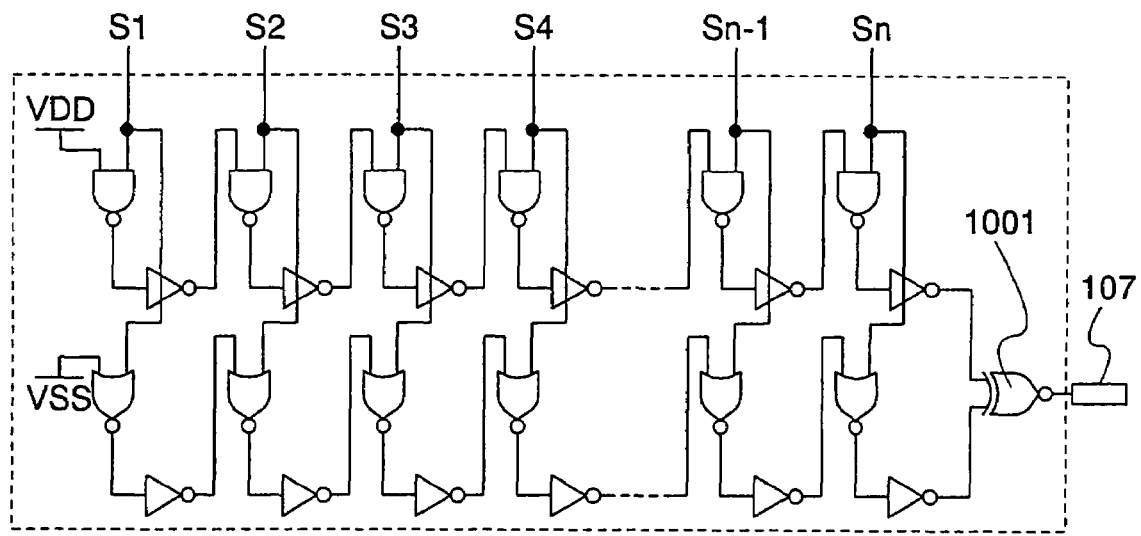
FIGS. 10A and 10B are diagrams showing another embodiment mode of the invention.
Figure 10B:
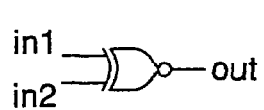
Figure 11:
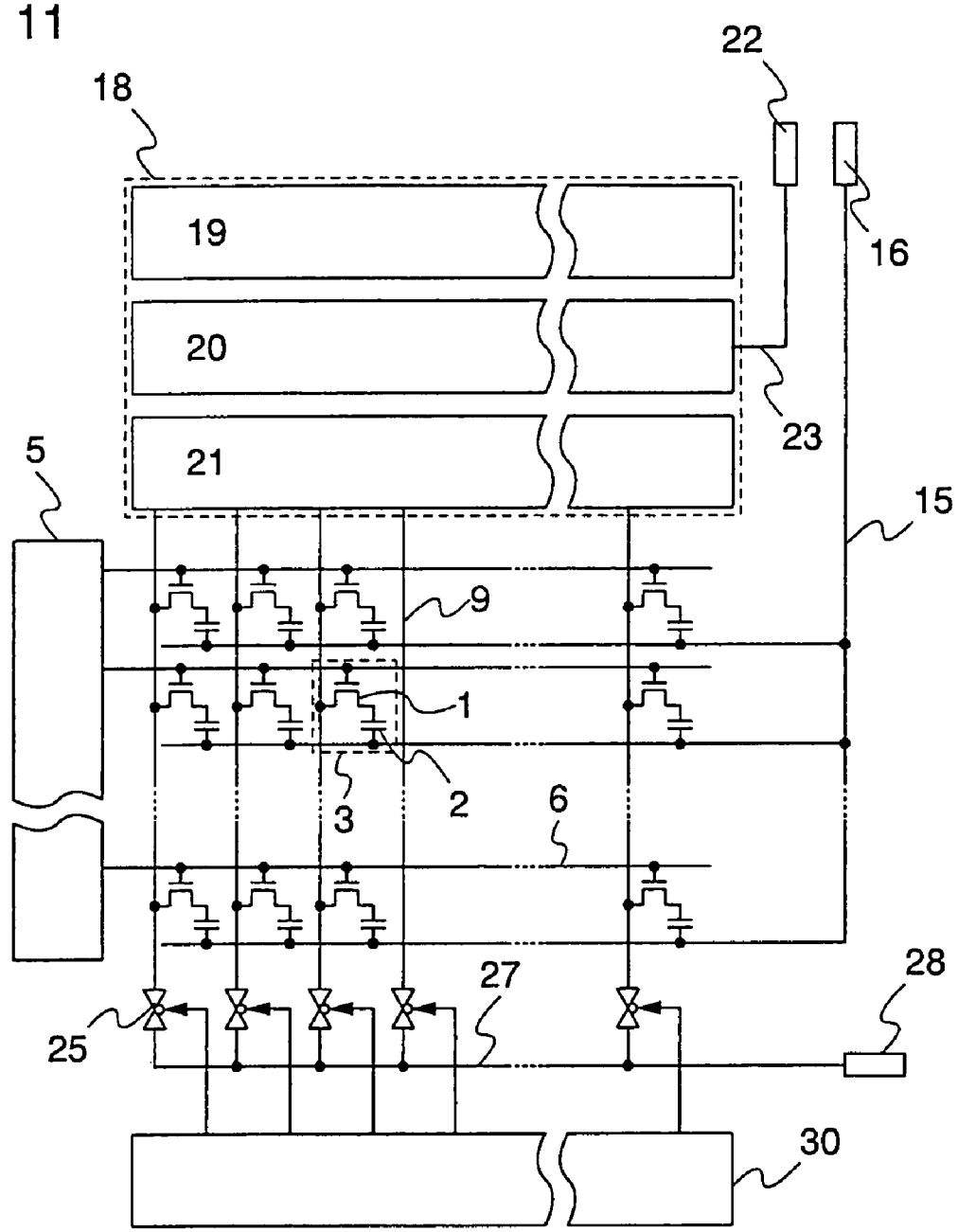
FIG. 11 is a diagram showing a configuration of a display device having a conventional inspecting circuit.
Figure 12A:
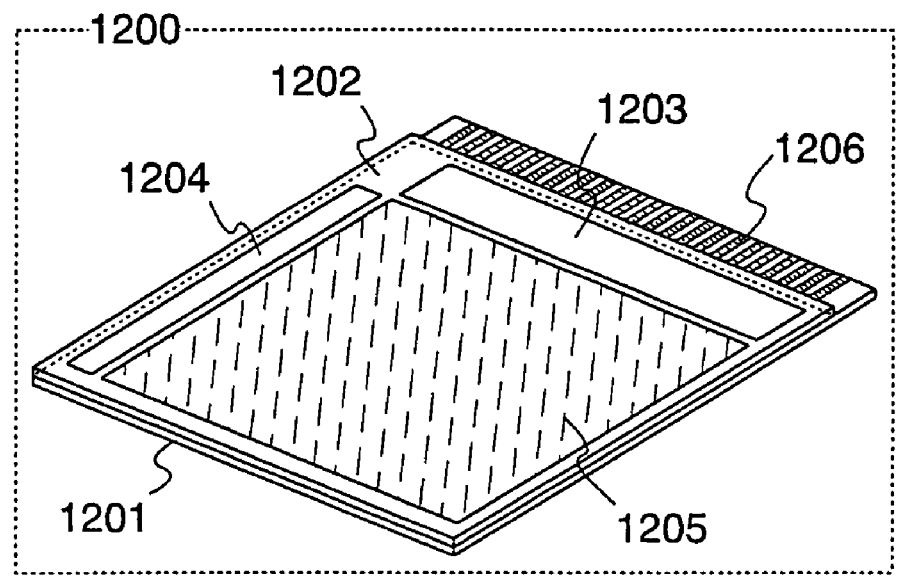
FIGS. 12A and 12B are diagrams showing a mode of a module and a quality inspection by using a probe.
Figure 12B:
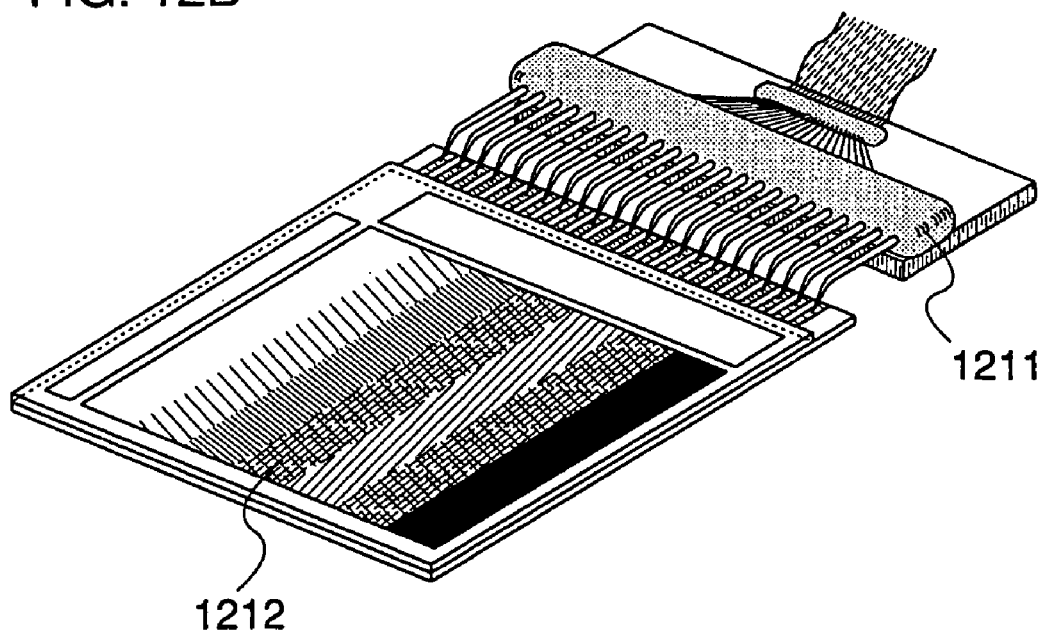

Specifically, as shown in FIGS. 10A and 10B, an ExNOR (Exclusive-NOR) 1001 which is inputted with signals obtained at two inspecting output terminals may be connected additionally in order to determine according to H-level or L-level of the inspecting output terminal 107. In the configuration shown in FIG. 10A, when an output of the ExNOR is H-level, it is determined to be good whereas when the output thereof is L-level, it is determined to be defective. FIG. 10B shows a two value table of the ExNOR circuit. Using an ExOR (Exclusive-OR) instead of the ExNOR is the same. In this case, when an output of the ExOR is L-level, it is determined to be good whereas when the output thereof is H-level, it is determined to be defective.

Further, in case that an input form of a video signal (Data) is an analog form, an inspection can be performed irrespective of a digital or analog form by inputting a digital signal equivalent to the maximum amplitude of an actual video signal as a signal for inspection only in inspection.

Further, the invention is characterized in that an inspection is completed with one to two patterns of determination waveforms without observing a waveform with time, by inputting output signals of a number of signal lines all at once to an inspecting circuit.

That is, a configuration of the inspecting circuit is not limited to FIG. 1B or FIG. 10, but a configuration which may provide an equivalent function with a different circuit configuration is included as well.

Embodiment Mode 2

The inspecting circuit and the inspecting method of the invention can easily realize an application to an inspection of operation of a gate driver. In this embodiment mode, the inspecting circuit described in Embodiment Mode 1 is used for the inspection of the operation of a gate driver as an example.

Figure 13:
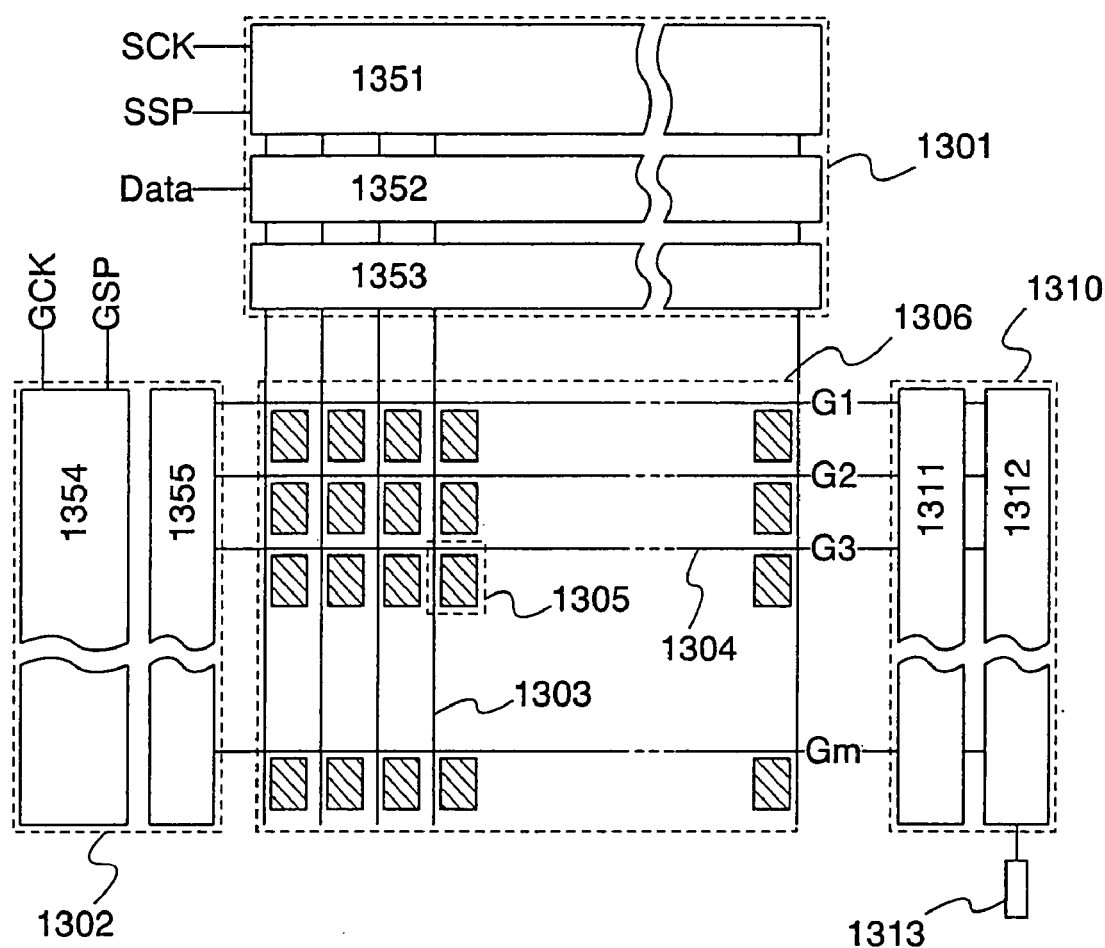
FIG. 13 is a diagram showing one embodiment mode of the invention.

FIG. 13 shows a configuration example. A source driver 1301, a gate driver 1302, a pixel region 1306, an inspecting circuit 1310, and an output terminal 1313 are formed on a substrate. The pixel region 1306 is formed of a plurality of pixels 1305 arranged in matrix. Each pixel is controlled by a source signal line 1303 and a gate signal line 1304.

The source driver 1301 outputs sampling pulses sequentially in a shift register and a NAND circuit 1351 in accordance with inputs of a clock signal (SCK) and a start pulse (SSP). After that, a video signal (Data) is sampled in a data latch 1352, and the pulses are converted in amplitude or amplified in a level shifter and a buffer 1353, and outputted to source signal lines sequentially.

The gate driver 1302 outputs select pulses sequentially in a shift register and an NAND circuit 1354 in accordance with the inputs of a clock signal (GCK) and a start pulse (GSP). After that, the pulses are converted in amplitude or amplified in a level shifter and a buffer 1355 and select a gate signal line (G1 to Gm) of each row sequentially.

Figure 14:
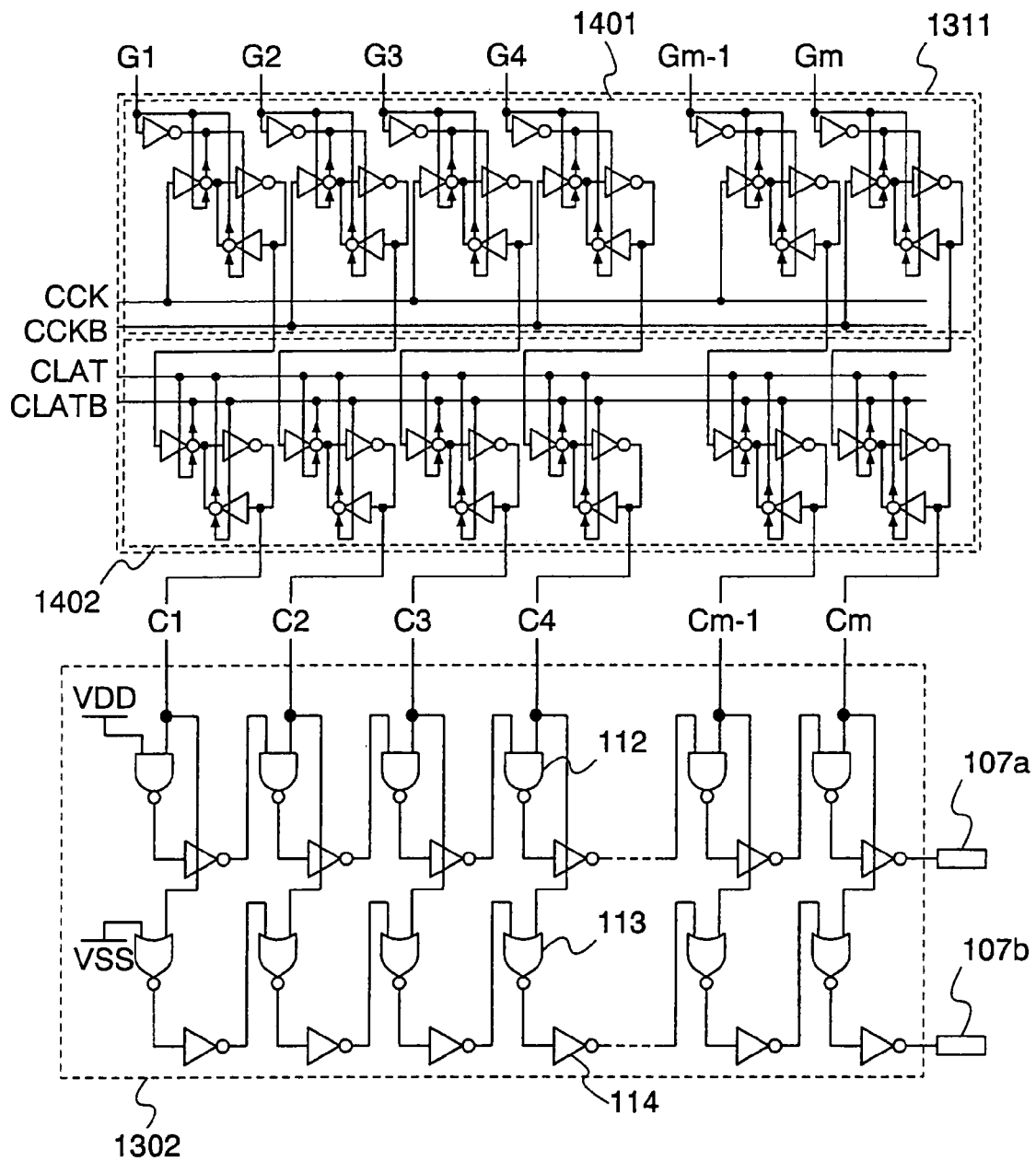
FIG. 14 is a diagram showing one embodiment mode of the invention.

FIG. 14 shows a configuration of the inspecting circuit 1310. Here, the inspecting circuit 1310 provided for inspecting the gate driver 1302 is described. The inspecting circuit 1310 is formed of a latch circuit 1311 which is formed of a first latch circuit 1401 and a second latch circuit 1402, and a determination circuit 1312. The determination circuit 1312 has a similar configuration to an inspecting circuit of a source driver, in which a plurality of NANDs 112 and a plurality of inverters 114 are connected alternately in series, a circuit connected to each gate signal line (G1 to Gm), a plurality of NORs 113, and a plurality of inverters 114 are connected alternately in series, circuits connected to each gate signal line (G1 to Gm) are provided in parallel, and outputs of both final lines are outputted to the inspecting output terminals 107a and 107b.

Next, a procedure of an actual inspection is described with reference to FIG. 13 and FIG. 14. To start the inspection, the gate driver 1302 is operated. An operating method may be similar to the case of performing a normal image display.

Figure 15:
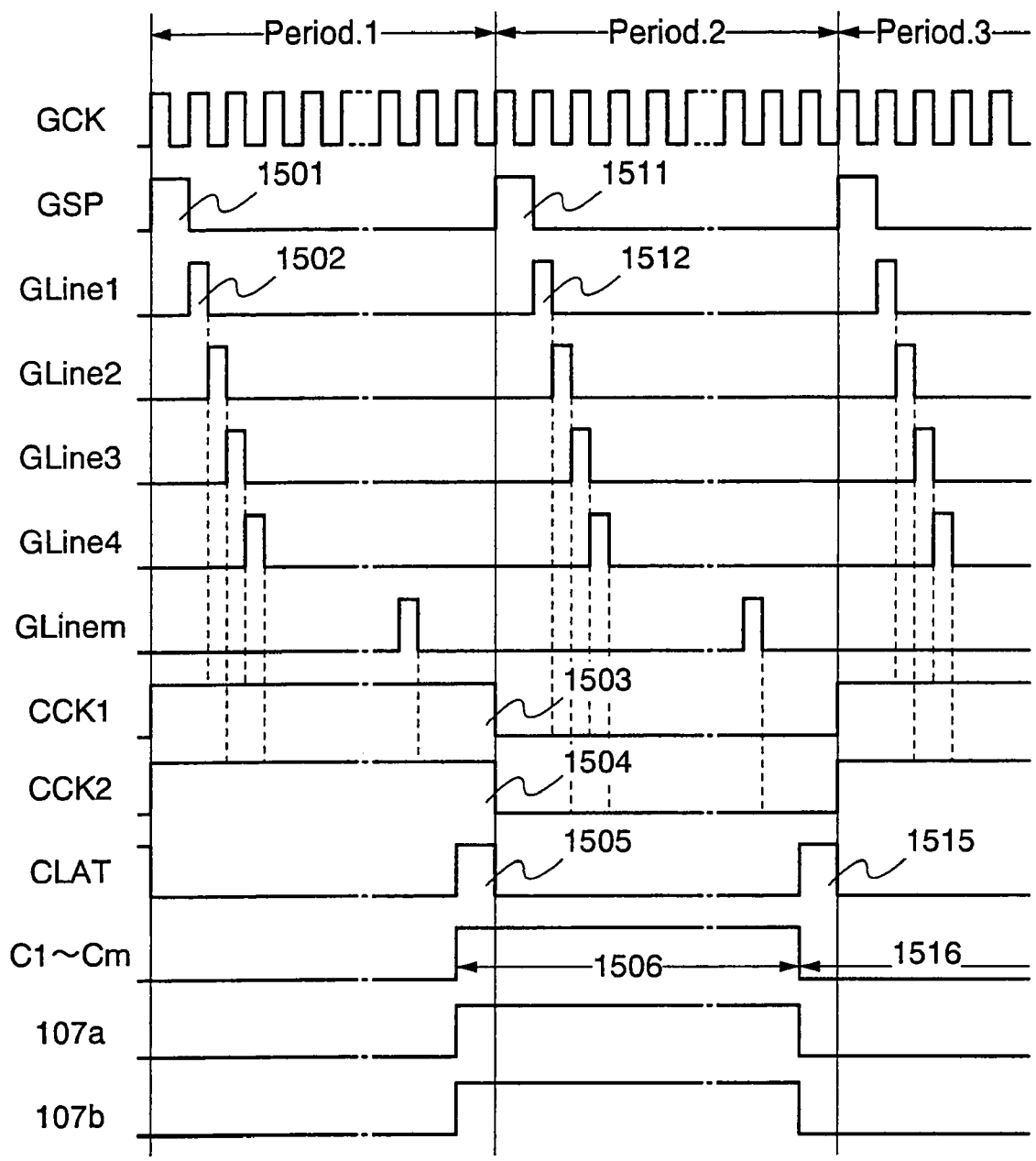
FIG. 15 is a diagram showing a timing chart of a gate driver and an inspecting circuit.

FIG. 15 shows a simple timing chart of the gate driver 1302 and the inspecting circuit 1310. The operations thereof are described sequentially below. FIG. 15 shows a clock signal (GCK) and a start pulse (GSP) as input signals on the driver side, signals for inspection (CCK1 and CCK2) and a data latch signal for inspection (CLAT) as input signals on the inspecting circuit side, row select pulses (GLine 1 to 4 and GLine m) of first to fourth rows and m-th row and an inspecting circuit latch outputs (C1 to Cm) as output signals.

First, a first frame period (Period 1) is described. A shift register operates in accordance with a clock signal (GCK) and a start pulse (GSP) 1501 and a row select pulse 1502 is sequentially outputted. After that, the row select pulse 1502 is converted in amplitude or amplified and selects a gate signal line of each row.

On the other hand, the row select pulse 1502 outputted sequentially is inputted to the first latch circuit 1401 in an inspecting circuit and samples a signal for inspection (CCK1 and CCK2) 1503 or 1504. In this period (Period 1), H-level is sampled in all the first latch circuits 1401. After the row select pulses 1502 are outputted from the first row to the final row to complete sampling of the first latch circuits 1401 of all the lines in the inspecting circuit, a data latch signal for inspection (CLAT) 1505 is inputted and data held in the first latch circuit 1401 is transferred to the second latch circuit 1402 all at once.

At this time, inspecting circuit latch outputs (C1 to C4 and Cm) are all H-level as shown in FIG. 15 (1506).

Next, a second frame period (Period 2) starts. Similarly to the first frame period, a row select pulse 1512 is sequentially outputted in accordance with a clock signal and a start pulse 1511 and selects a gate signal line of each row.

After that, the row select pulse 1512 which is sequentially outputted is inputted to the first latch circuit 1401 in the inspecting circuit and samples the signal for inspection (CCK1 and CCK2) 1503 or 1504. In this period (Period 2), L-level is set to be sampled in all the first latch circuits 1401. After the row select pulses 1512 are outputted from the first row to the final row to complete sampling of the first latch circuits 1401 of all the lines in the inspecting circuit, a data latch signal for inspection (CLAT) 1515 is inputted and data held in the first latch circuits 1401 is transferred to the second latch circuit 1402 all at once.

At this time, the inspecting circuit latch outputs (C1 to C4 and Cm) are all L-level (1516).

After that, a validity of a select timing of a gate signal line and the like is determined by a similar procedure to the inspection of a source driver described in Embodiment Mode 1. The determination circuit 1312 operates similarly, therefore, a description is omitted here.

Further, by inputting signals for inspection (CCK1 and CCK2) as clock signals having the same frequency as a clock signal on the gate driver side (GCK), for example, a defect can be determined by an output of the inspection even when an output timing of a row select pulse is invalid in a certain row. In this case, CCK1 is sampled in an odd row of a gate signal line and CCK2 is sampled in an even row thereof.

Figure 16:
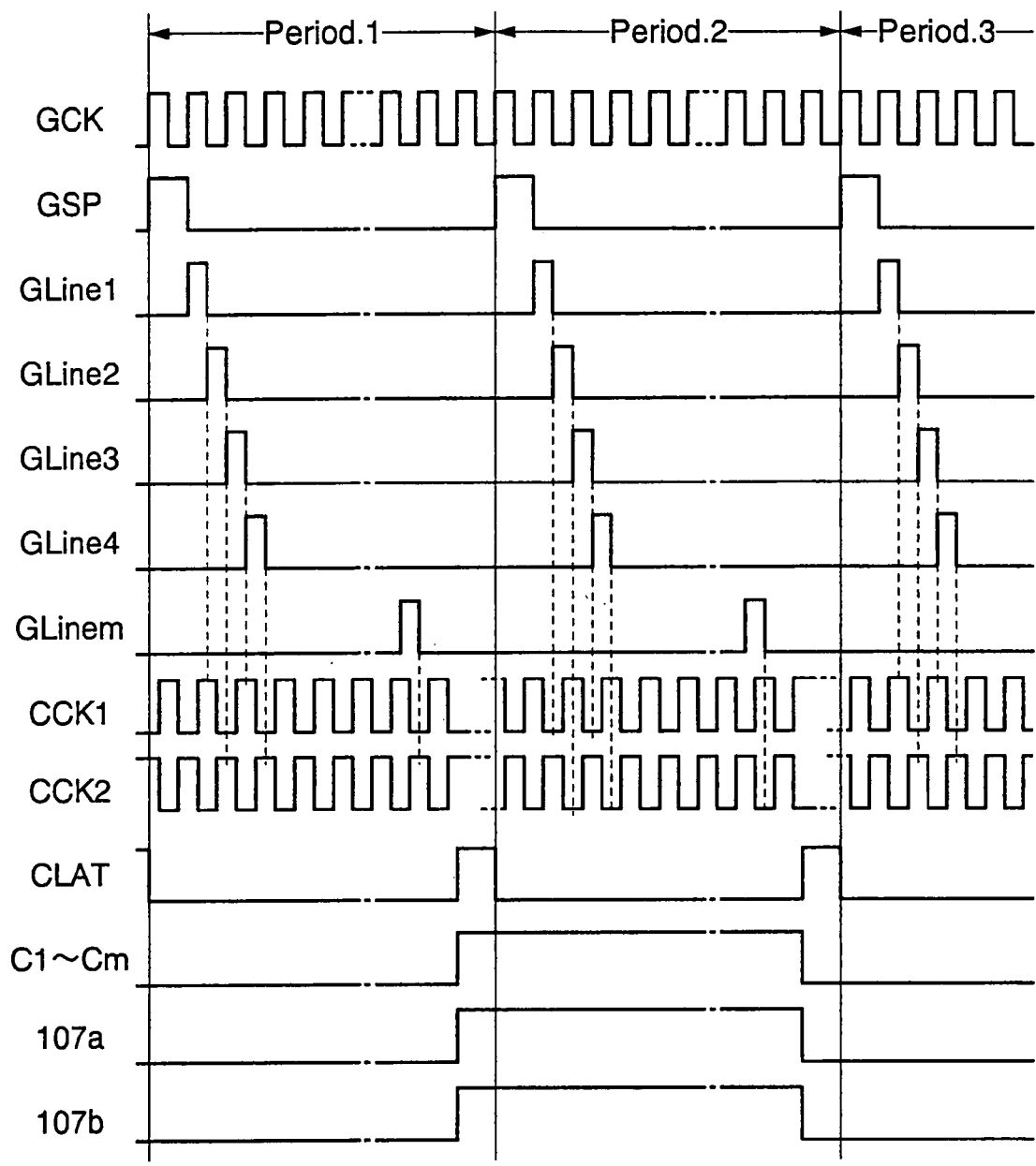
FIG. 16 is a diagram showing a timing chart of a gate driver and an inspecting circuit.

Specifically, in some cases, a row select pulse to be outputted sequentially has a defect such that a pulse width is increased at a certain point and the like due to a defect of a TFT in a shift register portion and the like. Normally, an operation of a shift register controlled by using a clock signal is triggered at an up edge or a down edge of the clock signal in many cases, therefore, a defect of a pulse width and the like is approximately as wide as a half cycle of a clock in many cases. In case that a timing of a latch operation in the inspecting circuit is determined by an invalid pulse as described here, it is determined to be normal by such a signal for inspection as described in FIG. 15. However, by using such a signal for inspection like a clock signal described in FIG. 16, logic of data in sampling is inverted in case that the first latch circuit 1401 operates at an invalid timing. Therefore, determination of defect can be performed at high precision.

Figure 17:
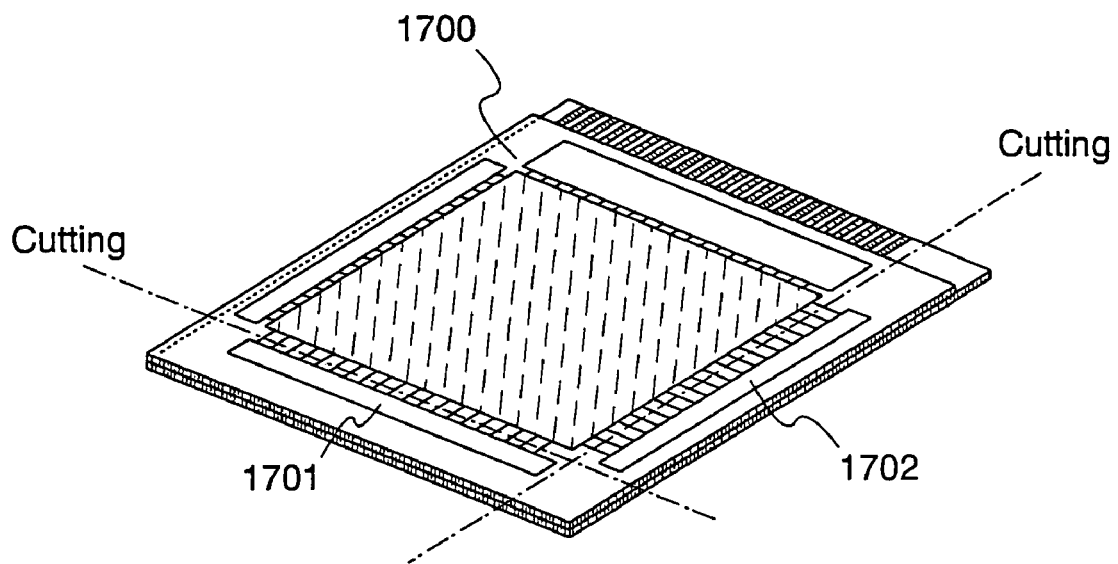
FIG. 17 is a diagram showing a cross sectional example of an inspecting circuit.
Figure 17:
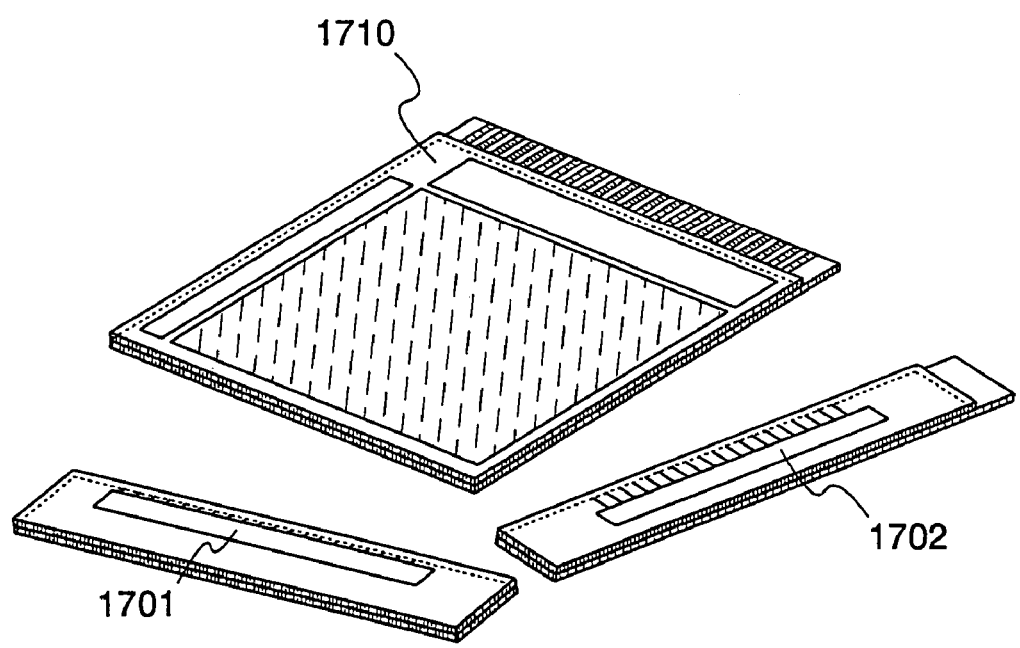

The inspecting circuits of the invention described in Embodiment Mode 1 and Embodiment Mode 2 are not required for a practical operation of a display device. Therefore, as shown in FIG. 17A, after forming over a substrate a first module 1700 in which inspecting circuits 1701 and 1702 are integrally formed, the inspecting circuits 1701 and 1702 may be removed as shown in FIG. 17B when cutting the substrate into a desired size finally through the above-described inspecting procedure to obtain a module 1710.

Further, an output determination and the like of an address decoder used in a memory and the like can use as well as to a display device, and a wide application to an inspection of a semiconductor device having a number of signal output pins can be expected.

The invention claimed is:

1. A semiconductor device comprising:
   a plurality of pixels;
   a plurality of signal lines;
   a plurality of first inverters; and
   a plurality of NANDs,
   wherein an output terminal of an (i−1)th NAND (i is an integer number of two or more) is electrically connected to a first input terminal of an i-th NAND through an (i−1)th first inverter,
   wherein second input terminals of the (i−1)th and i-th NANDs are connected to (i−1)th and i-th signal lines, respectively, and
   wherein the plurality of signal lines are connected to the plurality of pixels, respectively.

2. A semiconductor device according to claim 1, the semiconductor device further comprising:
   first and second output terminals;
   a plurality of NORs; and
   a plurality of second inverters,
   wherein an output terminal of an (i−1)th NOR is electrically connected to a first input terminal of an i-th NOR through an (i−1)th second inverter,
   wherein second input terminals of the (i−1)th and i-th NORs are connected to (i−1)th and i-th signal lines, respectively,
   wherein an output terminal of a final NAND is electrically connected to the first output terminal, and
   wherein an output terminal of a final NOR is electrically connected to the second output terminal.

3. A semiconductor device according to claim 1, the semiconductor device further comprising:
   a plurality of NORs;
   a plurality of second inverters; and
   a comparator circuit,
   wherein an output terminal of an (i−1)th NOR is electrically connected to a first input terminal of an i-th NOR an (i−1)th second inverter,
   wherein second input terminals of the (i−1)th and i-th NORs are connected to (i−1)th and i-th signal lines, respectively,
   wherein an output terminal of a final NAND is electrically connected to a first input terminal of the comparator circuit, and
   wherein an output terminal of a final NOR is electrically connected to a second input terminal of the comparator circuit.

4. A semiconductor device according to claim 3, wherein an ExNOR is used for the comparator circuit.

5. A semiconductor device comprising;
   a plurality of signal lines;

a plurality of NANDs; and
a plurality of NORs,
wherein an output terminal of an (i−1)th NAND (i is an integer number of two or more) is electrically connected to a first input terminal of an i-th NAND,
wherein an output terminal of an (i−1)th NOR is electrically connected to a first input terminal of an i-th NOR,
wherein second input terminals of the (i−1)th and i-th NANDs are connected to (i−1)th and i-th signal lines, respectively, and
wherein second input terminals of the (i−1)th and i-th NORs are connected to (i−1) th and i-th signal lines, respectively.

6. A semiconductor device according to claim 5, the semiconductor device further comprising:
a comparator circuit,
wherein an output terminal of a final NAND is electrically connected to a first input terminal of the comparator circuit, and
wherein an output terminal of a final NOR is electrically connected to a second input terminal of the comparator circuit.

7. A semiconductor device according to claim 6, wherein an ExNOR is used for the comparator circuit.

8. A semiconductor device comprising:
a plurality of input terminals;
first and second output terminals;
a plurality of NANDs;
a plurality of NORs;
a plurality of first inverters; and
a plurality of second inverters,
wherein an output terminal of an (i−1)th NAND (i is an integer number of two or more) is electrically connected to a first input terminal of an i-th NAND though an (i−1)th first inverter,
wherein an output terminal an (i−1)th NOR is electrically connected to a first input terminal of an i-th NOR through an (i−1)th second inverter,
wherein the (i−1)th and i-th input terminals are electrically connected to second input terminals of the (i−1)th and i-th NANDs and second input terminals of the (i−1)th and i-th NORs respectively,
wherein an output terminal of a final NAND is electrically connected to the first output terminal, and
wherein an output terminal of a final NOR is electrically connected to the second output terminal.

9. A semiconductor device comprising:
a plurality of signal lines;
a plurality of NANDs;
a plurality of NORs;
a plurality of first inverters;
a plurality of second inverters; and
a comparator circuit,
wherein an output terminal of an (i−1)th NAND (i is an integer number of two or more) is electrically connected to a first input terminal of an i-th NAND through an (i−1)th first inverter,
wherein an output terminal an (i−1)th NOR is electrically connected to a first input terminal of an i-th NOR through an (i−1)th second inverter,
wherein the (i−1)th and i-th signal lines are electrically connected to second input terminals of the (i−1)th and i-th NANDs and second input terminals of the (i−1)th and i-th NORs respectively,
wherein an output terminal of a final NAND is electrically connected to a first input terminal of the comparator circuit, and
wherein an output terminal of a final NOR is electrically connected to a second input terminal of the comparator circuit.

10. A semiconductor device according to claim 9, wherein an ExNOR is used for the comparator circuit.

11. A semiconductor device comprising:
a source driver which outputs a plurality of signals to a plurality of source signal lines;
a plurality of NANDs;
a plurality of NORs;
a plurality of first inverters; and
a plurality of second inverters,
wherein an output terminal of an (i−1)th NAND (i is an integer number of two or more) is electrically connected to a first input terminal of an i-th NAND through an (i−1)th first inverter,
wherein an output terminal an (i−1)th NOR is electrically connected to a first input terminal of an i-th NOR through an (i−1)th second inverter,
wherein the (i−1)th and i-th source signal lines are electrically connected to second input terminals of the (i−1)th and i-th NANDs and second input terminals of the (i−1) th and i-th NORs respectively,
wherein an output terminal of a final NAND is electrically connected to a first output terminal, and
wherein an output terminal of a final NOR is electrically connected to a second output terminal.

12. A semiconductor device comprising:
a source driver which outputs a plurality of signals to a plurality of source signal lines;
a plurality of NANDs;
a plurality of NORs;
a plurality of first inverters;
a plurality of second inverters; and
a comparator circuit,
wherein an output terminal of an (i−1)th NAND (i is an integer number of two or more) is electrically connected to a first input terminal of an i-th NAND through an (i−1)th first inverter,
wherein an output terminal an (i−1)th NOR is electrically connected to a first input terminal of an i-th NOR through an (i−1)th second inverter,
wherein the (i−1)th and i-th source signal lines are electrically connected to second input terminals of the (i−1)th and i-th NANDs and second input terminals of the (i−1) th and i-th NORs respectively,
wherein an output terminal of a final NAND is electrically connected to a first input terminal of the comparator circuit, and
wherein an output terminal of a final NOR is electrically connected to a second input terminal of the comparator circuit.

13. A semiconductor device according to claim 12, wherein an ExNOR is used for the comparator circuit.

14. A semiconductor device comprising:
a gate driver which outputs a plurality of signals to a plurality of gate signal lines;
a plurality of NANDs;
a plurality of NORs;
a plurality of first inverters; and
a plurality of second inverters,
wherein an output terminal of an (i−1)th NAND (i is an integer number of two or more) is electrically connected to a first input terminal of an i-th NAND through an (i−1)th first inverter, wherein an output terminal an (i−1)th NOR is electrically connected to a first input terminal of an i-th NOR through an (i−1)th second inverter, wherein the (i−1)th and i-th gate signal lines are electrically connected to second input terminals of the (i−1)th and i-th NANDs and second input terminals of the (i−1)th and i-th NORs respectively, wherein an output terminal of a final NAND is electrically connected to a first output terminal, and wherein an output terminal of a final NOR is electrically connected to a second output terminal.

15. A semiconductor device comprising:
a gate driver which outputs a plurality of signals to a plurality of gate signal lines;
a plurality of NANDs;
a plurality of NORs;
a plurality of first inverters;
a plurality of second inverters; and
a comparator circuit, wherein an output terminal of an (i−1)th NAND (i is an integer number of two or more) is electrically connected to a first input terminal of an i-th NAND through an (i−1)th first inverter, wherein an output terminal an (i−1)th NOR is electrically connected to a first input terminal of an i-th NOR through an (i−1)th second inverter, wherein the (i−1)th and i-th gate signal lines are electrically connected to second input terminals of the (i−1)th and i-th NANDs and second input terminals of the (i−1)th and i-th NORs respectively, wherein an output terminal of a final NAND is electrically connected to a first input terminal of the comparator circuit, and wherein an output terminal of a final NOR is electrically connected to a second input terminal of the comparator circuit.

16. A semiconductor device according to claim 15, wherein an ExNOR is used for the comparator circuit.

17. A semiconductor device according to claim 1, wherein the plurality of signal lines are a plurality of source signal lines.

* * * * *